(12) United States Patent
Moon et al.

(10) Patent No.: US 11,848,366 B2
(45) Date of Patent: *Dec. 19, 2023

(54) ELECTRONIC DEVICE AND METHOD OF MANUFACTURING THE SAME

(71) Applicant: Samsung Electronics Co., Ltd., Suwon-si (KR)

(72) Inventors: Taehwan Moon, Suwon-si (KR); Eunha Lee, Seoul (KR); Junghwa Kim, Yongin-si (KR); Hyangsook Lee, Suwon-si (KR); Sanghyun Jo, Seoul (KR); Jinseong Heo, Seoul (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/468,098

(22) Filed: Sep. 7, 2021

(65) Prior Publication Data

US 2021/0408255 A1 Dec. 30, 2021

Related U.S. Application Data

(63) Continuation of application No. 16/923,514, filed on Jul. 8, 2020, now Pat. No. 11,145,731.

(30) Foreign Application Priority Data

Dec. 23, 2019 (KR) .................. 10-2019-0173466

(51) Int. Cl.
*H01L 21/02* (2006.01)
*H01L 29/423* (2006.01)
(Continued)

(52) U.S. Cl.
CPC .. *H01L 29/42364* (2013.01); *H01L 21/02304* (2013.01); *H01L 21/02356* (2013.01);
(Continued)

(58) Field of Classification Search
CPC ... H01L 21/02; H01L 21/28; H01L 21/02304; H01L 21/02175; H01L 21/02181;
(Continued)

(56) References Cited

U.S. PATENT DOCUMENTS 8,158,976 B2 4/2012 Son et al.
8,278,700 B2 10/2012 Osabe et al.
(Continued)

FOREIGN PATENT DOCUMENTS

| EP | 2645440 A2 | 10/2013 |
|---|---|---|
| KR | 10-0513796 B1 | 9/2005 |
| WO | WO-2018/231210 A1 | 12/2018 |

OTHER PUBLICATIONS

Extended European Search report dated Dec. 14, 2020 in European Application No. 20185187.0.
(Continued)

*Primary Examiner* — Chuong A Luu
(74) *Attorney, Agent, or Firm* — HARNESS, DICKEY & PIERCE, P.L.C.

(57) ABSTRACT

Provided are an electronic device including a dielectric layer having an adjusted crystal orientation and a method of manufacturing the electronic device. The electronic device includes a seed layer provided on a substrate and a dielectric layer provided on the seed layer. The seed layer includes crystal grains having aligned crystal orientations. The dielectric layer includes crystal grains having crystal orientations aligned in the same direction as the crystal orientations of the seed layer.

20 Claims, 14 Drawing Sheets

(51) Int. Cl.
*H01L 21/28* (2006.01)
*H01L 49/02* (2006.01)
*H01L 29/51* (2006.01)
*H10B 12/00* (2023.01)

(52) U.S. Cl.
CPC ........ *H01L 21/28158* (2013.01); *H01L 28/40* (2013.01); *H01L 29/40111* (2019.08); *H01L 29/516* (2013.01); *H01L 29/518* (2013.01); *H10B 12/37* (2023.02)

(58) Field of Classification Search
CPC ......... H01L 21/02356; H01L 21/28158; H01L 21/28185; H01L 21/28291; H01L 21/8234; H01L 21/8238; H01L 21/28008; H01L 21/823437; H01L 21/823456; H01L 21/823828; H01L 21/82385; H01L 21/823814; H01L 21/823418; H01L 21/823425; H01L 29/49; H01L 29/51; H01L 29/66; H01L 29/78; H01L 29/423; H01L 29/513; H01L 29/516; H01L 29/518; H01L 29/6684; H01L 29/42364; H01L 29/78391; H01L 29/66787; H01L 29/66818; H01L 29/66545; H01L 29/66515; H01L 29/66643; H01L 29/66636; H01L 29/0843; H01L 29/0891; H01L 29/4991; H01L 29/42392; H01L 29/42312; H01L 27/108; H01L 27/10829; H01L 27/11585; H01L 27/11597; H01L 49/02; H01L 28/40; H01L 28/56; H01L 29/792; H01L 29/66477; H01L 29/66833; H10B 53/00; H10B 12/00; H10B 12/37
USPC ....................................................... 257/288
See application file for complete search history.

(56) References Cited

U.S. PATENT DOCUMENTS

| | | | |
|---|---|---|---|
| 11,145,731 B2* | 10/2021 | Moon | H01L 21/28185 |
| 2014/0356979 A1* | 12/2014 | Annunziata | H10N 50/80 438/3 |
| 2017/0345831 A1 | 11/2017 | Chavan et al. | |
| 2018/0166453 A1 | 6/2018 | Muller | |
| 2018/0350940 A1 | 12/2018 | Yoo | |
| 2019/0131382 A1 | 5/2019 | Lu et al. | |
| 2019/0131420 A1* | 5/2019 | Lu | H01L 29/40111 |
| 2019/0207035 A1 | 7/2019 | Chen et al. | |

OTHER PUBLICATIONS

Notice of Allowance dated Jul. 14, 2021 in U.S. Appl. No. 16/923,514.

* cited by examiner

ELECTRONIC DEVICE AND METHOD OF MANUFACTURING THE SAME

CROSS-REFERENCE TO RELATED APPLICATION

This application is a Continuation of U.S. application Ser. No. 16/923,514, filed on Jul. 8, 2020, which claims the benefit of Korean Patent Application No. 10-2019-0173466, filed on Dec. 23, 2019, in the Korean Intellectual Property Office, the disclosures of each of which are incorporated herein in its entirety by reference.

BACKGROUND

1. Field

The disclosure relates to an electronic device and a method of manufacturing the same, and more particularly, to an electronic device including a dielectric layer having an adjusted crystal orientation and a method of manufacturing the electronic device.

2. Description of Related Art

Silicon-based electronic devices, according to the related art, are limited in the improvements for their operating characteristics and for scaling down. For example, when the operating voltage and current characteristics of a silicon-based logic transistor, according to the related art, are measured the subthreshold swing (SS) is known to be limited to about 60 mV/dec. Furthermore, as the size of the logic transistor is decreased, it may be difficult to lower the operating voltage to 0.8 V or less due to the above limitation. Accordingly, as the power density in the silicon-based logic transistor increases, there may be a limitation in scaling down of the logic transistor.

SUMMARY

Provided are electronic devices including a dielectric layer, the dielectric layer having an adjusted crystal orientation and a method of manufacturing the electronic device.

Additional aspects will be set forth in part in the description which follows and, in part, will be apparent from the description, or may be learned by practice of the presented embodiments of the disclosure.

According to an aspect of an embodiment, an electronic device includes a substrate, a seed layer on the substrate, the seed layer including crystal grains having aligned crystal orientations; a dielectric layer on the seed layer, the dielectric layer including crystal grains having crystal orientations aligned in the same direction as the crystal orientations of the seed layer; and an electrode on the dielectric layer.

A source, a drain, and a channel layer between the source and drain may be at an upper surface of the substrate, the channel layer may be at a position corresponding to the electrode. The electrode may be a gate electrode.

The channel layer may include at least one of Si, Ge, a group III-V semiconductor, an oxide semiconductor, a nitride semiconductor, an oxynitride semiconductor, a two-dimensional semiconductor material, a quantum dot, and an organic semiconductor.

The seed layer may include at least one of an oxide, a nitride, a chalcogenide, and a two-dimensional insulator material.

The oxide may include at least one oxide of Y, Si, Al, Hf, Zr, La, Mo, W, Ru, and Nb. The oxide may further include a dopant.

The seed layer may have a thickness of about 0.5 nm to about 3 nm.

The dielectric layer may include a ferroelectric.

The dielectric layer may include at least one oxide of Hf, Si, Al, Zr, Y, La, Gd, or Sr. The dielectric layer may further include a dopant.

The dielectric layer may have a thickness of about 0.5 nm to about 20 nm.

The crystal orientation of the crystal grains of the seed layer and the dielectric layer may have a <111> orientation.

According to another aspect of an embodiment, in the electronic device the electrode may be a first electrode, and the substrate may be a second electrode.

According to another aspect of an embodiment, a method of manufacturing an electronic device includes preparing a substrate having a channel layer therein, forming a seed layer on the channel layer, the seed layer including crystal grains having aligned crystal orientations, forming a dielectric layer on the seed layer, the dielectric layer including crystal grains having crystal orientations aligned in the same direction as the crystal orientations of the seed layer, and forming a gate electrode on the dielectric layer.

The forming of the seed layer may include depositing a first amorphous dielectric material layer on the channel layer and crystallizing the deposited first amorphous dielectric material layer.

The forming of the seed layer may include transferring crystal grains having aligned crystal orientations onto the channel layer.

The forming of the dielectric layer, the dielectric layer including crystal grains having crystal orientations aligned in the same direction as the crystal orientations of the seed layer may be formed by depositing a second amorphous dielectric material layer on the seed layer and crystallizing the deposited second amorphous dielectric material layer.

The dielectric layer may include a ferroelectric.

The dielectric layer may include at least one oxide of Hf, Si, Al, Zr, Y, La, Gd, and Sr. The dielectric layer may further include a dopant.

The electronic device may be a capacitor, and may have a remnant polarization.

The electronic device may be included as part of a memory device, the memory including a transistor and the electronic device contacted to a source region of the transistor.

The electronic device may include an amorphous dielectric layer between the seed layer and the substrate.

The electronic device may include a crystalline dielectric layer having a crystal orientation different from the aligned crystal orientations of the seed layer between the seed layer and the substrate.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
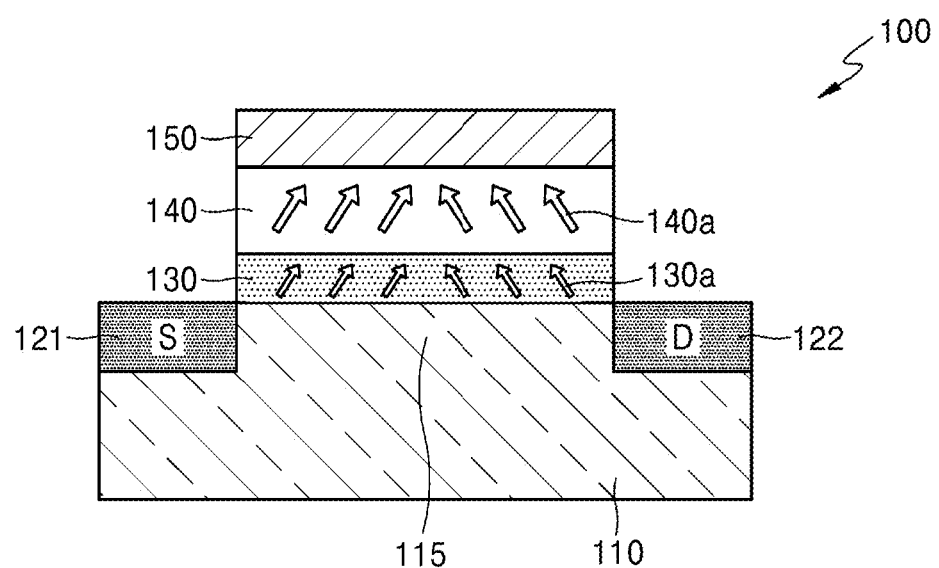
FIG. 1 is a cross-sectional view of an electronic device according to an example embodiment.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects. As used herein, the term "and/or" includes any and all combinations of one or more of the associated listed items. Expressions such as "at least one of," when preceding a list of elements, modify the entire list of elements and do not modify the individual elements of the list.

In the following description, when a constituent element is disposed "above" or "on" to another constituent element, the constituent element may be only directly on the other constituent element or above the other constituent elements in a non-contact manner An expression used in a singular form in the specification also includes the expression in its plural form unless clearly specified otherwise in context. It will be further understood that the terms "comprises" and/or "comprising" used herein specify the presence of stated features or components, but do not preclude the presence or addition of one or more other features or components. Spatially relative terms, such as "above," "below," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. The device may be otherwise oriented (rotated 90 degrees or at other orientations) and the spatially relative descriptors used herein interpreted accordingly. In addition, when an element is referred to as being "between" two elements, the element may be the only element between the two elements, or one or more other intervening elements may be present.

The use of the terms "a" and "an" and "the" and similar referents in the context of describing the disclosure are to be construed to cover both the singular and the plural. Also, the steps of all methods described herein can be performed in any suitable order unless otherwise indicated herein or otherwise clearly contradicted by context. The disclosure is not limited to the described order of the steps. The use of any and all examples, or language (e.g., "such as") provided herein, is intended merely to better illuminate the disclosure herein, and does not pose a limitation on the scope of the disclosure unless otherwise claimed.

When the terms "about" or "substantially" are used in this specification in connection with a numerical value, it is intended that the associated numerical value includes a manufacturing tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Further, regardless of whether numerical values or shapes are modified as "about" or "substantially," it will be understood that these values and shapes should be construed as including a manufacturing or operational tolerance (e.g., ±10%) around the stated numerical values or shapes.

FIG. 1 is a cross-sectional view of an electronic device 100 according to an example embodiment. The electronic device 100 illustrated in FIG. 1, which is a semiconductor based device, may have a gate stack structure including a dielectric layer 140 and a gate electrode 150. The dielectric layer 140 may comprise, for example, a ferroelectric material. The electronic device 100 may include, for example, a logic device and/or a memory device.

Referring to FIG. 1, the electronic device 100 may include a substrate 110 and may further include a seed layer 130, a dielectric layer 140, and a gate electrode 150, which are sequentially stacked on the substrate 110. A channel layer 115 may be provided at an upper surface of the substrate 110 at a position corresponding to the gate electrode 150, and a source 121 and a drain 122 may be respectively provided at sides of the channel layer 115.

The source 121 may be electrically connected to one side of the channel layer 115, and the drain 122 maybe electrically connected to the other side of the channel layer 115. The source and drain 121 and 122 may be formed by injecting impurities in different regions of the substrate 110, and an area of the substrate 110 between the source 121 and the drain 122 may be defined to be the channel layer 115. Alternatively, the source and drain 121 and 122 may include a conductive material deposited on different sides of the channel layer 115.

The substrate 110 may be a semiconductor substrate and may, for example, comprise a Si substrate, but may include a material other than Si. For example, substrate 110 may comprise Ge, SiGe, and/or a group III-V semiconductor. In this case, the channel layer 115 may include Si, Ge, SiGe, and/or group III-V semiconductor. In this case, the channel layer 115 may be in the substrate, for example as part of the substrate defined by the source and drain 121 and 122. The semiconductor substrate can be crystalline or polycrystalline. The material of the substrate 110 is not limited to the above materials and may be variously changed. Meanwhile, the channel layer 115, as described below, may be formed as a material layer separate from the substrate 110 and not as part of the substrate 110.

The seed layer 130 and the dielectric layer 140 may be sequentially stacked on an upper surface of the channel layer 115 of the substrate 110. The seed layer 130 may be provided to have crystal orientations 130a aligned in a certain direction, and the dielectric layer 140 may be provided to have crystal orientations 140a aligned in the same directions as those of the seed layer 130.

Figure 2:
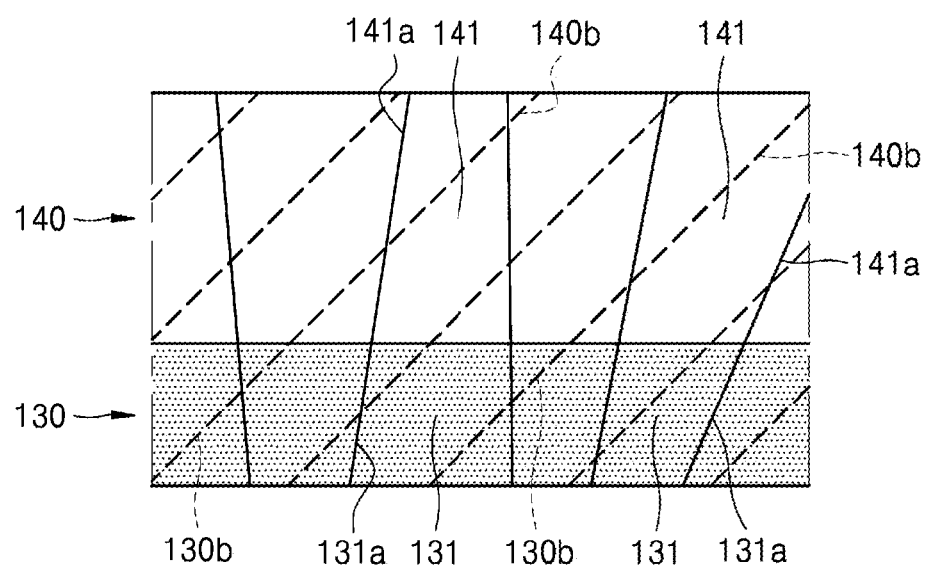
FIG. 2 is an enlarged cross-sectional view of a seed layer and a dielectric layer of FIG. 1.

FIG. 2 is an enlarged cross-sectional view of the seed layer 130 and the dielectric layer 140 of FIG. 1.

Referring to FIG. 2, the seed layer 130 may include a plurality of crystal grains 131 sectioned by a crystal grain boundary 131a. In this state, crystal grains 131 forming the seed layer 130 may have the crystal orientations 130a of FIG. 1 aligned in a certain direction. In FIG. 2, reference numeral 130b denotes crystal faces of the crystal grains 131 forming the seed layer 130, and generally, the crystal faces 130b may be formed to be perpendicular to the crystal orientations 130a.

For example, the crystal grains 131 forming the seed layer 130 may have <111> crystal orientations. However, this is merely an example, and the crystal grains 131 forming the seed layer 130 may have different crystal orientations. The term "<111>" denotes a Miller index indicating a crystal orientation in crystallography and may denote the <111> family of directions. For example, the <111> crystal orientation may indicate the [111], [-111], [1-11], [11-1], [-1-11], [-11-1], [1-1-1], and [-1-1-1] crystal orientations. The <111> family of directions may by equivalent, for example, due to the symmetry operations in the crystal.

The seed layer 130 may include, for example, an oxide, a nitride, a chalcogenide, and/or a two-dimensional insulator material. However, the present disclosure is not limited thereto.

The oxide may include, for example, at least one oxide of Y, Si, Al, Hf, Zr, La, Mo, W, Ru, and/or Nb. The oxide may further include a dopant. The dopant may be an oxide. In this case, the dopant may include, for example, at least one of Si, Al, Zr, Y, La, Gd, Sr, and/or Hf. The dopant may be an oxide. The nitride may include, for example, InN.

The chalcogenide may include, for example, MoTe, WTe, HfS, and/or ZrS. The two-dimensional insulator material may include, for example, hexagonal-boron nitride (h-BN).

The seed layer 130 may have a lattice parameter between the lattice parameters of the substrate 110 and the dielectric layer 140; and/or the seed layer may be thin enough to prevent and/or mitigate the lattice strain due to lattice mismatch between the materials of the seed layer 130 and the substrate 110. The seed layer 130 may, therefore, also promote adhesion between the substrate 110 and the dielectric layer 140 by acting as an intermediate layer, thus preventing the decohesion of the dielectric layer 140 from the substrate 110 due to lattice mismatch.

The seed layer 130 may be formed, as described below, by depositing an amorphous dielectric material layer on an upper surface of the channel layer 115 of the substrate 110 by a deposition method such as chemical vapor deposition (CVD), atomic layer deposition (ALD), and/or physical vapor deposition (PVD), and then crystallizing the deposited amorphous dielectric material layer. Furthermore, the seed layer 130 may be formed by a transfer method. The seed layer 130 may be formed to a thickness of, for example, about 0.5 nm to 3 nm.

As described above, the dielectric layer 140 is provided on an upper surface of the seed layer 130 having an adjusted crystal orientation. The dielectric layer 140 may include a plurality of crystal grains 141 sectioned by a crystal grain boundary 141a. In this state, the crystal grains 141 forming the dielectric layer 140 may have the crystal orientations 140a aligned in the same direction as the crystal orientations 130a of the seed layer 130. In FIG. 2, reference numeral 140b denotes crystal faces of the crystal grains 141 forming the dielectric layer 140, and the crystal faces 140b may be perpendicular to the crystal orientations 140a. The crystal grains 141 forming the dielectric layer 140 may have the crystal faces 140b that are the same as the crystal faces 130b of the seed layer 130.

The dielectric layer 140 may be formed, as described below, by depositing an amorphous dielectric material layer on the upper surface of the seed layer 130 having the crystal orientations 130a that are adjusted, and then crystallizing the deposited amorphous dielectric material layer. The seed layer 130 may help promote the nucleation of seed crystals during the annealing of the dielectric layer 140. The seed crystals may be oriented in the same crystal orientations 130a as the seed layer 130. The dielectric layer 140 may be formed from the already-nucleated seeds increasing in size and/or from the formation of new nucleated seeds at the interface between the seed layer 130 and the amorphous dielectric material. Therefore, as the amorphous dielectric material layer is crystallized through an annealing process, the crystal grains 141 having the crystal orientations 140a aligned in the same direction as those of the seed layer 130 grow, and thus the dielectric layer 140 having the crystal orientations 140a that are adjusted may be formed.

For example, when the crystal grains 131 forming the seed layer 130 has the <111> crystal orientations, the crystal grains 141 forming the dielectric layer 140 may have the same <111> crystal orientations as those of the crystal grains 131 of the seed layer 130.

The dielectric layer 140 may include a ferroelectric. Ferroelectrics have spontaneous dipoles (electric dipole). That is, ferroelectrics may spontaneous polarize because to a charge distribution in a unit cell in a crystallized material structure which is non-centrosymmetric. The ferroelectric also has a remnant polarization by dipoles even when no external magnetic field exists. Also, the polarization direction may be switched in units of domains by an external electric field. The ferroelectric may or may not have hysteresis characteristics according to the external electric field.

The dielectric layer 140 may include an oxide, for example, at least one oxide of Hf, Si, Al, Zr, Y, La, Gd, and/or Sr. However, this is merely an example. Furthermore, the dielectric layer 140 may further include a dopant, as necessary. In this state, the dopant may include, for example, at least one of Si, Al, Zr, Y, La, Gd, Sr, and/or Hf. When the dielectric layer 140 includes a dopant, the dopant may be doped at an overall consistent (e.g., same) concentration or different concentrations according to regions. Furthermore, regions of the dielectric layer 140 may be doped with doping materials different from each according to the region of the dielectric layer 140.

The dielectric layer 140 may be formed, as described below, by depositing amorphous dielectric thin film on the upper surface of the seed layer 130 by a deposition method such as CVD, ALD, and PVD, and then crystallizing the deposited amorphous dielectric thin film through annealing. The dielectric layer 140 may have a thickness greater than or equal to the seed layer 130. The dielectric layer 140 may have a thickness of, for example, about 0.5 nm to 20 nm.

The gate electrode 150 may be on an upper surface of the dielectric layer 140. In this state, the gate electrode 150 may be disposed facing the channel layer 115 of the substrate 110. The gate electrode 150 may include an electrically conductive material, for example, a metal, a doped semiconductor, and/or an electrically conductive carbon-based compound like graphene and/or a conductive polymer.

In the electronic device 100 according to the present embodiment, as the dielectric layer 140 is formed as a ferroelectric, the subthreshold swing (SS) of the electronic device 100 may be lowered.

Figure 3:
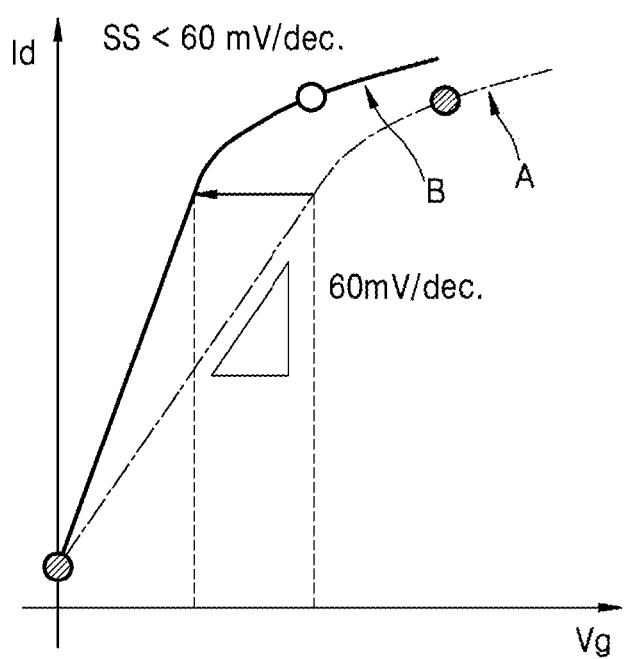
FIG. 3 is a graph showing an effect of improving sub-threshold swing (SS) characteristics of an electronic device according to an example embodiment.

FIG. 3 is a graph showing an effect of improving the SS characteristics of a logic transistor according to an embodiment. In FIG. 3, "A" denotes operating voltage Vg and current Id characteristics of the silicon-based logic transistor according to the related art, and "B" denotes operating voltage Vg and current Id characteristics of a logic transistor according to an example embodiment.

Referring to FIG. 3, in the silicon-based transistor according to the related art, SS is known to be limited to about 60 mV/dec. However, in the logic transistor according to an example embodiment, by using a ferroelectric layer, when the domain in a ferroelectric is switched due to a negative capacitance effect, voltage amplification is generated so that SS may be reduced to about 60 mV/dec or less.

In the electronic device 100 according to the present embodiment, as the ferroelectric included in the dielectric layer 140 includes the crystal grains 141 having the aligned crystal orientations 140a, the polarization characteristics of the dielectric layer 140 and the performance of the electronic device 100 may be improved.

In an electronic device including the ferroelectric according to the related art, crystal grains of a ferroelectric are arranged in random directions. However, in the electronic device 100 according to the present embodiment, as the ferroelectric included in the dielectric layer 140 includes the crystal grains 141 having the aligned crystal orientations 140a, remnant polarization may be large compared to the electronic device according to the related art. Accordingly, the polarization characteristics of the dielectric layer 140 may be improved.

Furthermore, in the electronic device 100, according to the present example embodiment, as the polarization directions are aligned and thus a depolarization field increased, and as the negative capacitance effect increases, SS may be further lowered. Accordingly, the performance of the electronic device 100 may be further improved. For example, the minimum operating threshold voltage of the electronic device 100 may be about 0.8 V or less, however the present disclosure is not limited thereto.

Figure 4:
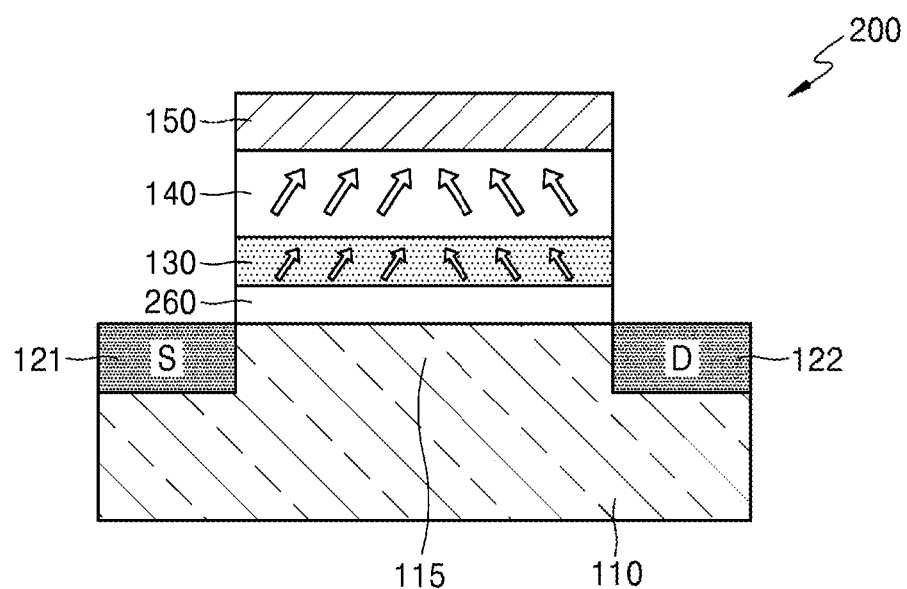
FIG. 4 is a cross-sectional view of an electronic device according to another example embodiment.

FIG. 4 is a cross-sectional view of an electronic device 200 according to another embodiment. The electronic device 200 illustrated in FIG. 4 is the same as the electronic device 100 of FIG. 1, except that an amorphous dielectric layer 260 is provided between the seed layer 130 and the channel layer 115.

Referring to FIG. 4, the amorphous dielectric layer 260 may be provided between the channel layer 115 of the substrate 110 and the seed layer 130. The amorphous dielectric layer 260 may include, for example, at least one oxide of Hf, Si, Al, Zr, Y, La, Gd, and/or Sr, the present disclosure is not limited thereto. Alternatively, instead of the above-described amorphous dielectric layer 260, a crystalline dielectric layer (not shown) having a crystal orientation different from that of the seed layer 130 may be provided between the channel layer 115 of the substrate 110 and the seed layer 130. In either the amorphous dielectric layer 260 and/or the crystalline dielectric layer (not shown), the layer may act, for example, as an intermediate layer, between the substrate 110 and the seed layer 130. As noted above, an intermediate layer may help prevent and/or mitigate the decohesion of the layers above and below the intermediate layer. Either intermediate layer (e.g., the amorphous dielectric layer 260 and/or the crystalline dielectric layer (not shown)) may also assist in the formation of the seed layer 130 with crystal orientations 130a by acting as a barrier between the seed layer 130 and the substrate 110 during the annealing of the seed layer 130, thus preventing and/or mitigating a crystal lattice of the substrate from interfering or affecting the crystal formation in the seed layer 130.

Figure 5:
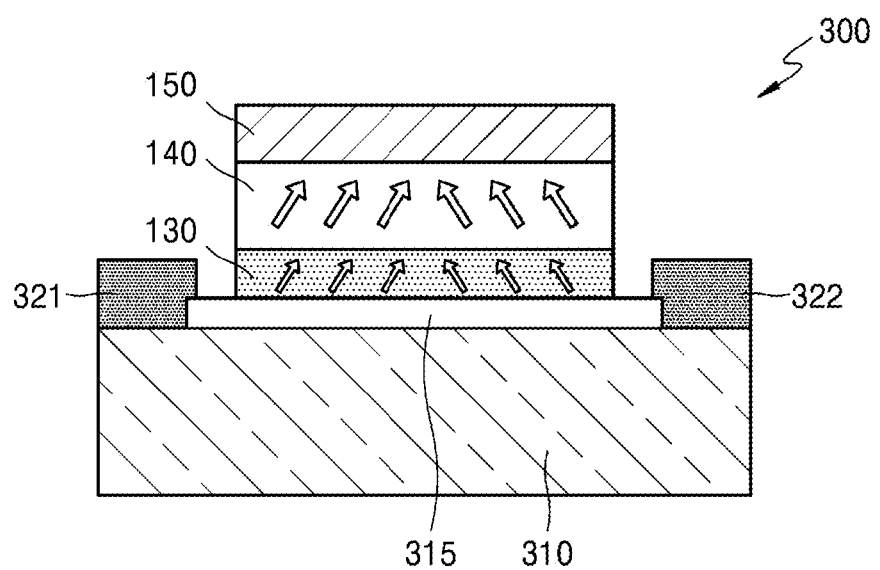
FIG. 5 is a cross-sectional view of an electronic device according to another example embodiment.

FIG. 5 is a cross-sectional view of an electronic device 300 according to another embodiment. In the following description, differences from the above-described embodiment are mainly discussed.

Referring to FIG. 5, the electronic device 300 may include a substrate 310, and a channel layer 315, the seed layer 130, the dielectric layer 140, and the gate electrode 150, which are sequentially deposited on the substrate 310. A source electrode 321 and a drain electrode 322 may be provided at both sides of the channel layer 315.

Although the substrate 310 may include a semiconductive material, for example, Si, Ge, and/or group III-V semiconductor, the present disclosure is not limited thereto. The channel layer 315 may be provided on an upper surface of the substrate 310. The channel layer 315 may be provided as a material layer spaced apart from the substrate 310 (e.g., not a part of the substrate 310). The channel layer 315 may include, for example, at least one of an oxide semiconductor, a nitride semiconductor, an oxynitride semiconductor, a two-dimensional semiconductor material, a quantum dot (QD), and/or an organic and/or carbon based semiconductor. In this state, the oxide semiconductor may include, for example, InGaZnO, the two-dimensional material may include, for example, transition metal dichalcogenide (TMD), molybdenum disulfide ($MoS_2$) and/or graphene, the quantum dot may include a colloidal quantum dot and/or a nanocrystal structure, and the organic and/or carbon based semiconductor may include, for example, carbon nanotubes (CNT) and/or other pi-bonded molecules. However, this is merely an example, and the present disclosure is not limited thereto.

A source electrode 321 and a drain electrode 322 may be provided at both sides of a channel layer 315. The source electrode 221 may be connected to one side of the channel layer 215, and the drain electrode 222 may be connected to the other side of the channel layer 215. The source electrode 221 and the drain electrode 222 may be formed of a conductive material such as a metal, a metal compound, and/or a conductive carbon based material such as a conductive polymer and/or carbon material pi-bonded like graphene and/or armchair carbon nanotubes.

As the seed layer 130 and the dielectric layer 140 and the gate electrode 150 sequentially are deposited on the channel layer 315 as described above, detailed descriptions thereof are omitted. Meanwhile, although not illustrated in FIG. 5, an amorphous dielectric layer may be further provided between the channel layer 315 and the seed layer 130 or a crystalline dielectric layer having a crystal orientation different from the seed layer 130 may be further provided.

Figure 6:
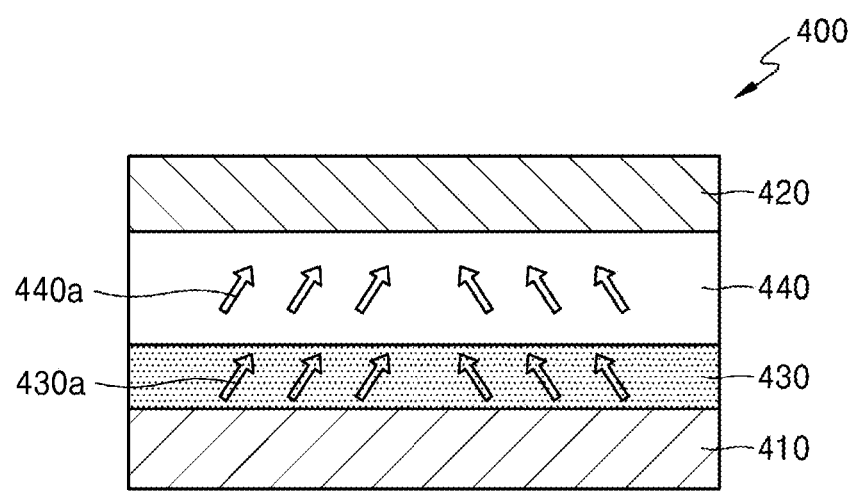
FIG. 6 is a cross-sectional view of an electronic device according to another example embodiment.

FIG. 6 is a cross-sectional view of an electronic device 400 according to another embodiment. The electronic device 400 illustrated in FIG. 6 may be, for example, a capacitor.

Referring to FIG. 6, the electronic device 400 may include the first and second electrodes 410 and 420 spaced apart from each other, a seed layer 430 provided between the first and second electrodes 410 and 420, and a dielectric layer 440 provided between the seed layer 430 and the second electrode 420. In this state, the dielectric layer 440 may include a ferroelectric.

Each of the first and second electrodes 410 and 420 may include a conductive material, for example a metal. In this case, the electronic device 400 may be a capacitor having a metal-ferroelectric-metal (MFM) structure. Furthermore, the first electrode 410 may include a semiconductor, and the second electrode 420 may include a conductive metal. In this case, the electronic device 400 may be a capacitor having a metal-ferroelectric-semiconductor (MFS) structure.

The seed layer 430 is provided on an upper surface of the first electrode 410, and the dielectric layer 440 is provided on an upper surface of the seed layer 430. In this state, the seed layer 430 may have crystal orientations 430a aligned in a certain direction, and the dielectric layer 440 may have crystal orientations 440a aligned in the same direction as those of the seed layer 430. The first and second electrodes 410 and 420 may have crystal orientations different from those of the seed layer 430 and the dielectric layer 440.

The seed layer 430 may include crystal grains (not shown) having the crystal orientations 430a aligned in a certain direction. The dielectric layer 440 may include crystal grains (not shown) having the crystal orientations 440a aligned in the same direction as the crystal orientations 430a of the crystal grains of the seed layer 430.

For example, both of the crystal grains forming the seed layer 430 and the crystal grains forming the dielectric layer 440 may have the <111> crystal orientations. However, this is merely an example, and the crystal grains forming the seed layer 430 and the crystal grains forming the dielectric layer 440 may have different crystal orientations.

The seed layer 430 may include an insulating material, for example, an oxide, a nitride, a chalcogenide, and/or a two-dimensional insulator material. However, the present disclosure is not limited thereto. The seed layer 430 may have a thickness of, for example, about 0.5 nm to 3 nm.

The dielectric layer 440 may include an insulating material, for example, at least one oxide of Hf, Si, Al, Zr, Y, La, Gd, and/or Sr. However, this is merely an example. Furthermore, the dielectric layer 440 may further include a dopant, as necessary. In this state, the dopant may include, for example, at least one of Si, Al, Zr, Y, La, Gd, Sr, and/or Hf. The dopant and the material oxide may include the same and/or different elements. The dielectric layer 440 may have a thickness of, for example, about 0.5 nm to 20 nm.

In the electronic device 400 according to the present embodiment, as the ferroelectric included in the dielectric layer 440 includes crystal grains having the crystal orientations 440a that are aligned, remnant polarization and capacitance of the electronic device 400 may be large compared to the electronic device according to the related art.

Figure 10:
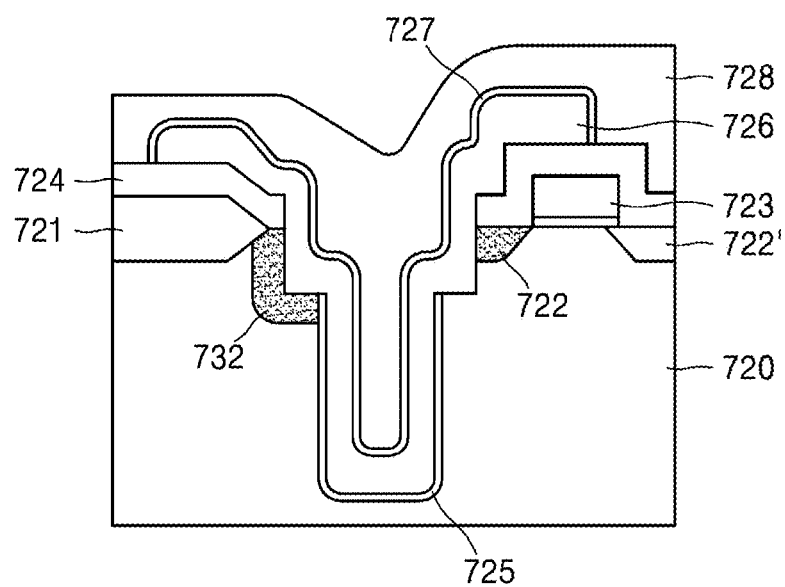
FIG. 10 illustrates a structure of a trench capacitor-type dynamic random access memory (DRAM).

FIG. 10 illustrates a structure of a trench capacitor-type dynamic random access memory (DRAM).

Referring to FIG. 10, on a semiconductor substrate 720, a device isolation region may be defined with a field oxide film 721, and a gate electrode 723 and source/drain impurity regions 722 and 722' may be formed in the device isolation region. An oxide film may be formed as an interlayer insulating film 724. A region not to be a trench may be capped with a trench buffer layer, and a part of the source region 722 may be open to form a contact portion.

A trench is formed in a sidewall of the interlayer insulating film 724, and a sidewall oxide film 725 may be formed over the entire sidewall of the trench. The sidewall oxide film 725 may compensate for damage in the semiconductor substrate caused by etching to form the trench, and may serve as a dielectric film between the semiconductor substrate 720 and a storage electrode 726. A sidewall portion of part of the source region 722, except for the other part of the source region near the gate electrode 723, may be entirely exposed.

A PN junction (not illustrated) may be formed in the sidewall portion of the source region by impurity implantation. The trench may be formed in the source region 722. A sidewall of the trench near the gate may directly contact the source region 722, and the PN junction may be formed by additional impurity implantation into the source region.

A storage electrode 726 may be formed on part of the interlayer insulating film 724, the exposed source region 722, and the surface of the sidewall oxide film 725 in the trench. The storage electrode 726 may be formed to contact the entire source region 722 in contact with the upper sidewall of the trench, in addition to the part of the source region 722 near the gate electrode 723. Next, an insulating film 727 as a capacity dielectric film may be formed along the upper surface of the storage electrode 726, and a polysilicon layer as a plate electrode 728 may be formed thereon, thereby completing a trench capacitor type DRAM. The insulating film 727, for example, may be an embodiment of the seed layer and dielectric layer provided between the first and second electrodes, such that the storage electrode 726 is a first electrode and the plate electrode 728 is a second electrode.

Figure 7:
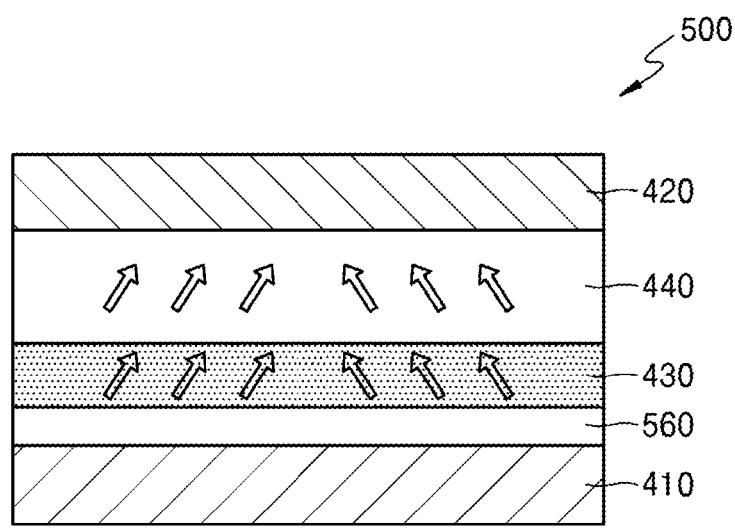
FIG. 7 is a cross-sectional view of an electronic device according to another example embodiment.

FIG. 7 is a cross-sectional view of an electronic device 500 according to another embodiment. The electronic device 500 illustrated in FIG. 7 is the same as the electronic device 400 of FIG. 6, except that an amorphous dielectric layer 560 is provided between the first electrode 410 and the seed layer 430. The electronic device 500 of FIG. 7 may be a capacitor having a metal-ferroelectric-insulator-metal (MFIM) structure and/or a capacitor having a metal-ferroelectric-insulator-semiconductor (MFIS) structure.

Referring to FIG. 7, the amorphous dielectric layer 560 may be provided between the first electrode 410 and the seed layer 430. In this state, although the amorphous dielectric layer 560 may include, for example, at least one oxide of Hf, Si, Al, Zr, Y, La, Gd, and/or Sr, the present disclosure is not limited thereto. Meanwhile, instead of the amorphous dielectric layer 560, a crystalline dielectric layer (not shown) having different crystal orientations from those of the seed layer 430 may be provided between the first electrode 410 and the seed layer 430.

Figure 8A:
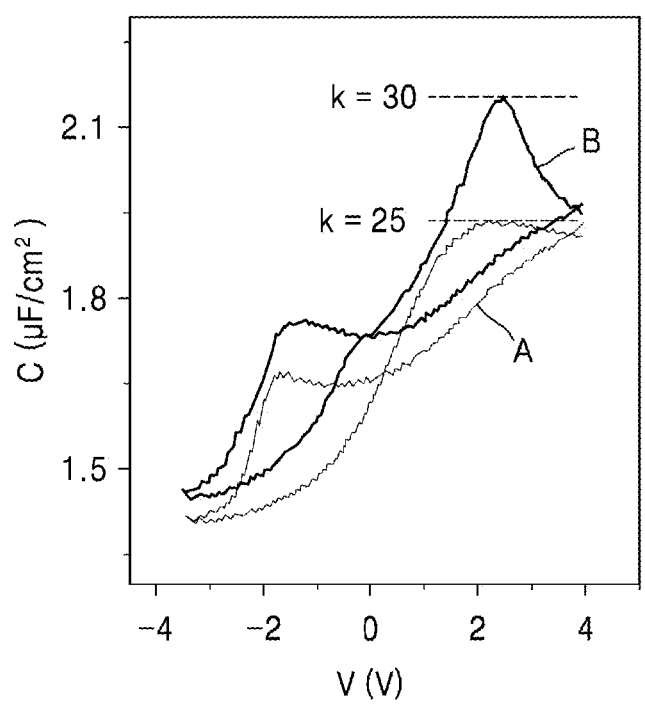
FIG. 8A is a graph showing a comparison between the capacitance of a general electronic device and the capacitance of an electronic device according to an example embodiment.
Figure 8B:
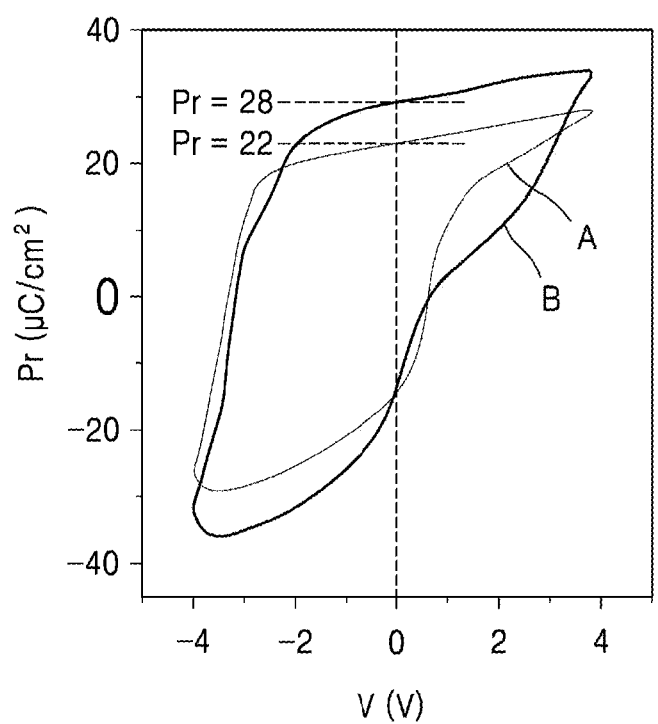
FIG. 8B is a graph showing a comparison between the remnant polarization of a general electronic device and the remnant polarization of an electronic device according to an example embodiment.

In the following description, referring to FIGS. 8A and 8B, the performance of a general electronic device and the performance of the electronic device according to an embodiment are compared with each other. In FIGS. 8A and 8B, "A" denotes the general electronic device and "B" denotes the electronic device according to an example embodiment. In this state, the general electronic device and the electronic device according to an embodiment use a capacitor having an MFIS structure.

The general electronic device has a structure in which a silicon oxide, an HfZrO ferroelectric layer, and a Mo layer are sequentially deposited on a p-type silicon substrate. In this state, the HfZrO ferroelectric layer includes crystal grains having random crystal orientations and has a thickness of about 7 nm. The electronic device according to the example embodiment has a structure in which a silicon oxide, an HfZrO seed layer, an HfZrO ferroelectric layer, and a Mo layer are sequentially deposited on the p-type silicon substrate. In this state, the HfZrO seed layer includes crystal grains having the <111> crystal orientations and has a thickness of about 2 nm. The HfZrO ferroelectric layer includes crystal grains having the <111> crystal orientations and has a thickness of about 5 nm.

FIG. 8A is a graph showing a comparison between the capacitance of the general electronic device and the capacitance of the electronic device according to the example embodiment. Referring to FIG. 8A, it may be seen that, in the electronic device according to an embodiment, a dielectric constant value k is increased compared to the general electronic device, and thus capacitance is increased.

FIG. 8B is a graph showing a comparison between the remnant polarization of the general electronic device and the remnant polarization of the electronic device according to the example embodiment. Referring to FIG. 8B, it may be seen that, in the electronic device according to the embodiment, a remnant polarization Pr is increased compared to the general electronic device, and thus polarization characteristics are improved.

FIGS. 9A to 9D are cross-sectional views for describing a method of manufacturing an electronic device according to an example embodiment.

Figure 9A:
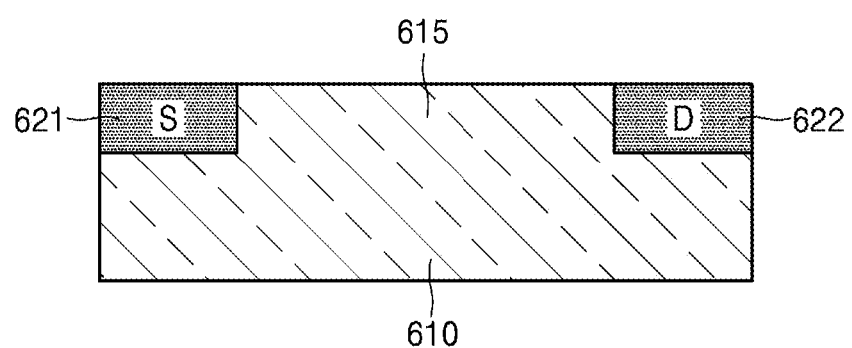
FIGS. 9A to 9D are cross-sectional views for describing a method of manufacturing an electronic device according to an embodiment.

Referring to FIG. 9A, a substrate 610, in which a channel layer 615, a source 621, and a drain 622 are provided, is prepared. The source 621 and the drain 622 may be formed by implanting/doping impurities in different regions of the substrate 610, and a region of the substrate 610 between the source 621 and the drain 622 may be defined to be a channel layer 615.

The substrate 610 may include, for example, Si, Ge, SiGe, and/or a Group III-V semiconductor. In this case, the channel layer 615 may include Si, Ge, SiGe, and/or a Group III-V semiconductor, like the substrate 610. The material of the substrate 610 is not limited to the above description and may be variously changed. Meanwhile, the formation time points of the source 621 and the drain 622 may vary. For example, the substrate 610 may be fabricated to include a source 621 and the drain 622, and/or the source 621 and drain 622 may be formed in the substrate 610 after a gate electrode 650 of FIG. 9D, which is described later, is formed.

The channel layer 615 may be formed on an upper surface of the substrate 610 as a material layer spaced apart from the substrate 610 (e.g., not a part of the substrate 610). In this case, the materials of the channel layer 615 may be configured in various ways. For example, the channel layer 615 may include at least one of an oxide semiconductor, a nitride semiconductor, an oxynitride semiconductor, a two-dimensional material, a quantum dot, and/or an organic and/or carbon based semiconductor. The oxide semiconductor may include, for example, InGaZnO, the two-dimensional material may include, for example, $MoS_2$, TMD, and/or graphene, the quantum dot may include a colloidal quantum dot and/or a nanocrystal structure, and the organic and/or carbon based semiconductor may include, for example, carbon nanotubes (CNT) and/or other pi-bonded molecules. However, this is merely an example, and the present disclosure is not limited thereto.

Figure 9B:
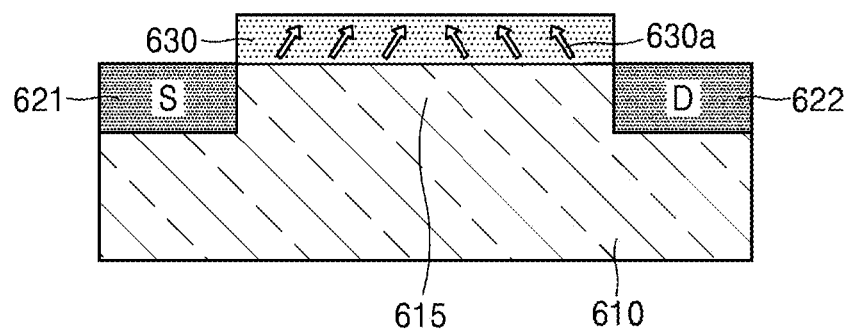

Referring to FIG. 9B, a seed layer 630 including crystal grains having crystal orientations 630a that are aligned is formed on an upper surface of the channel layer 615 of the substrate 610. Although the seed layer 630 may include, for example, an oxide, a nitride, a chalcogenide, and/or a two-dimensional insulator material, the present disclosure is not limited thereto.

The oxide may include, for example, at least one oxide of Y, Si, Al, Hf, Zr, La, Mo, W, Ru, and/or Nb. The oxide may further include a dopant. In this case, the dopant may include, for example, at least one of Si, Al, Zr, Y, La, Gd, Sr, and/or Hf. The nitride may include, for example, InN. The chalcogenide may include, for example, MoTe, WTe, HfS, and/or ZrS. The two-dimensional insulator material may include, for example, h-BN.

The seed layer 630 may be formed by depositing a first amorphous dielectric material layer (not shown) on the upper surface of the channel layer 615 of the substrate 610 and then crystallizing the deposited first amorphous dielectric material layer. The first amorphous dielectric material layer may be deposited by, for example, CVD, ALD, and PVD. The seed layer 630 may be formed by crystallizing the first amorphous dielectric material layer through an annealing process. In the crystallization process of the first amorphous dielectric material layer, as crystal grains having the crystal orientations 630a aligned in a certain direction grow, the seed layer 630 may be formed. The seed layer 630 may include a dopant. The dopant may be injected into the formed seed layer 630 and/or deposited during the formation of the first amorphous dielectric material layer. The dopant may be included, for example, as interstitial dopants between lattice vertices, as substitutions in the lattice, and/or at the boundaries between crystal grains.

The formation of the seed layer 630 may depend on the material of the seed layer 630, the type and concentration of the dopant, and/or an annealing temperature. The annealing temperature of the first amorphous dielectric material layer may be, for example, about 300° C. to about 1000° C., however the present disclosure is not limited thereto. The seed layer 630 may have a thickness of about 0.5 nm to about 3.0 nm. However, this is merely an example embodiment, and the present disclosure is not limited thereto.

The seed layer 630 may include, for example, crystal grains having the <111> crystal orientations. However, this is merely an example, and the seed layer 630 may include crystal grains having different crystal orientations.

The seed layer 630 may be formed by a transfer method, instead of the above-described deposition method. In this case, the seed layer 630 may be formed by transferring a dielectric thin film including crystal grains having crystal orientations aligned in a certain direction to the upper surface of the channel layer 615 of the substrate 610.

Meanwhile, although it is not illustrated in the drawings, before the seed layer 630 is formed, an amorphous dielectric layer may be formed on the upper surface of the channel layer 615 of the substrate 610, and/or a crystalline dielectric layer having crystal orientations different from those of the seed layer 630 may be formed. For example, the amorphous dielectric layer and/or the crystalline dielectric layer may be formed on the upper surface of the seed layer 630 by a deposition method, for example, CVD, ALD, and PVD and/or by a transfer method.

Figure 9C:
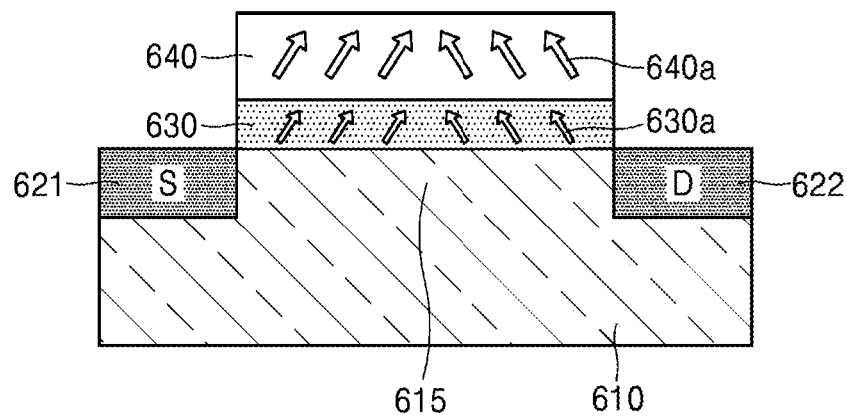

Referring to FIG. 9C, a dielectric layer 640 including crystal grains having crystal orientations 640a that are aligned is formed on an upper surface of the seed layer 630. In this state, the dielectric layer 640 includes crystal grains having the crystal orientations 640a aligned in the same direction as the crystal orientations 630a of the seed layer 630. For example, when the crystal grains forming the seed layer 630 have the <111> crystal orientations, the crystal grains forming the dielectric layer 640 may have the <111> crystal orientations that are the same crystal direction as the seed layer 630.

The dielectric layer 640 may include a ferroelectric. Although the dielectric layer 640 may include, for example, at least one oxide of Hf, Si, Al, Zr, Y, La, Gd, and/or Sr, this is merely an example.

The dielectric layer 640 may be formed by depositing a second amorphous dielectric material layer (not shown) on the upper surface of the seed layer 630 and then crystallizing the second amorphous dielectric material layer. The second amorphous dielectric material layer may be deposited on the upper surface of the seed layer 630 by, for example, CVD, ALD, and PVD. The second amorphous dielectric material layer may be crystallized through an annealing process to be formed as the dielectric layer 640. In the crystallization process of the second amorphous dielectric material layer, as the crystal grains having the crystal orientations 640a aligned in the same direction as the crystal orientations 630a of the seed layer 630 grow, the dielectric layer 640 may be formed.

Furthermore, the dielectric layer 640 may further include a dopant, as necessary. In this state, the dopant may include, for example, at least one of Si, Al, Zr, Y, La, Gd, Sr, and/or Hf. When the dielectric layer 640 includes a dopant, the dopant may be doped at the same concentration throughout the layer and/or at different concentrations according to regions. A different doping material may be doped according to regions of the dielectric layer 640. The dopant may be injected into the formed seed layer 630 and/or deposited during the formation of the second amorphous dielectric material layer. The dopant may be included, for example, as interstitial dopants between lattice vertices, as substitutions in the lattice, and/or at the boundaries between crystal grains.

The formation of the dielectric layer 640 from the second amorphous dielectric material lay may be dependent on the material of the dielectric layer 640, the type and concentration of the dopant, and/or an annealing temperature. Although the annealing temperature of the second amorphous dielectric material layer may be, for example, lower than the annealing temperature of the above-described first amorphous dielectric material layer, the present disclosure is not limited thereto. The dielectric layer 640 may have a thickness of about 0.5 nm to 20 nm. However, this is merely an example.

Figure 9D:
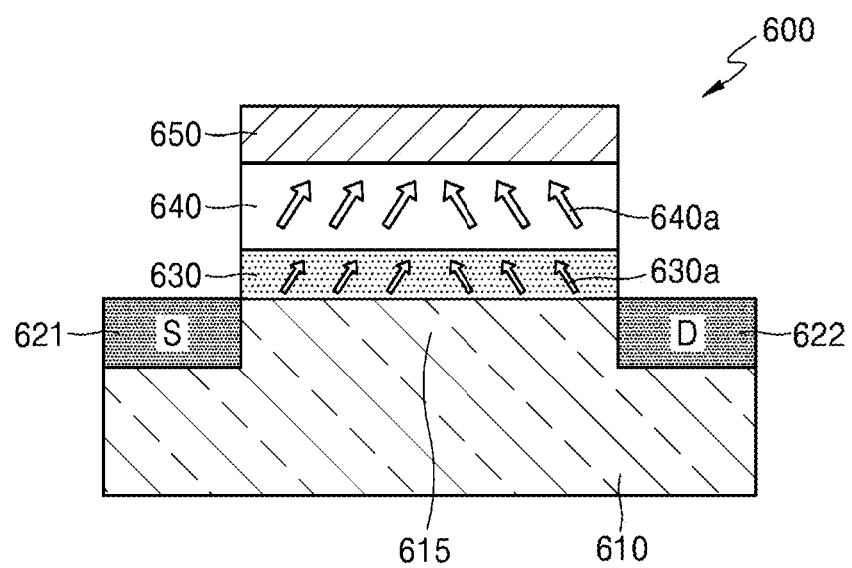

Referring to FIG. 9D, as a gate electrode 650 is formed on an upper surface of the dielectric layer 640, the electronic device 600 according to an example embodiment is completed. The gate electrode 650 may be formed by depositing a conductive material by, for example, CVD, PVD, and/or ALD. Then the deposited conductive material may be annealed. The gate electrode 650 may also be formed by a transfer method.

Meanwhile, in the above description, when the annealing processes are performed, respectively, the seed layer 630 is formed, the dielectric layer 640 is formed, and the gate electrode 650 is formed. However, after the first amorphous dielectric material layer and the second amorphous dielectric material layer are sequentially deposited on the upper surface of the channel layer 615 of the substrate 610, the seed layer 630 and the dielectric layer 640 are formed through an annealing process. The annealing process forming the seed layer 630 and the dielectric layer 640 may be the same process and/or different process, and may be at the same and/or different times. For example, a first annealing process to form the seed layer 630 may be performed at a higher temperature than a second annealing process to form the dielectric layer 640. Alternatively, an annealing process may be used form both the seed layer 630 and the dielectric layer 640. Then, after a conductive material is deposited on the upper surface of the dielectric layer 640, the gate electrode 650 may be formed through another annealing process. Furthermore, after the first amorphous dielectric material layer, the second amorphous dielectric material layer, and the conductive material are sequentially deposited on the upper surface of the channel layer 615 of the substrate 610, the seed layer 630, the dielectric layer 640, and the gate electrode 650 may be formed through the annealing process.

According to the above-described embodiments, as the dielectric layer is formed as a ferroelectric, the subthreshold swing of an electronic device may be lowered. Furthermore, as the ferroelectric included in the dielectric layer includes crystal grains having aligned crystal orientations, the remnant polarization may be increased, and thus the polarization characteristics of a ferroelectric thin film may be improved. Furthermore, as the polarization directions are aligned, a depolarization field increases, and as the negative capacitance effect increases, the subthreshold swing may be further lowered. Accordingly, the performance of an electronic device may be further improved. Although the embodiments have been described above, these are merely examples, and various modifications are possible by those skilled in the art.

It should be understood that embodiments described herein should be considered in a descriptive sense only and not for purposes of limitation. Descriptions of features and/or aspects within each embodiment should typically be considered as available for other similar features and/or aspects in other embodiments. While one and/or more embodiments have been described with reference to the figures, it will be understood by those of ordinary skill in the art that various changes in form and details may be made therein without departing from the spirit and scope as defined by the following claims.

What is claimed is:

1. A ferroelectric thin film structure comprising:
   a seed layer on a substrate, the seed layer including crystal grains having aligned crystal orientations; and
   a dielectric layer on the seed layer, the dielectric layer comprising a ferroelectric and including crystal grains having crystal orientations aligned in the same direction as the crystal orientations of the seed layer,
   wherein a material of the seed layer is selected such that the aligned crystal orientations of the seed layer are stable at an annealing temperature of the dielectric layer.

2. A ferroelectric thin film structure of claim 1, wherein the seed layer comprises at least one of an oxide, a nitride, a chalcogenide, and a two-dimensional insulator material.

3. A ferroelectric thin film structure of claim 2, wherein the oxide comprises at least one oxide of Y, Si, Al, Hf, Zr, La, Mo, W, Ru, and Nb.

4. A ferroelectric thin film structure of claim 3, wherein the oxide further comprises a dopant.

5. A ferroelectric thin film structure of claim 1, wherein the seed layer has a thickness of about 0.5 nm to about 3 nm.

6. A ferroelectric thin film structure of claim 1, wherein the dielectric layer comprises at least one oxide of Hf, Si, Al, Zr, Y, La, Gd, and Sr.

7. A ferroelectric thin film structure of claim 6, wherein the dielectric layer further comprises a dopant.

8. A ferroelectric thin film structure of claim 1, wherein the dielectric layer has a thickness of about 0.5 nm to about 20 nm.

9. A ferroelectric thin film structure of claim 1, wherein the crystal orientations of the crystal grains of the seed layer and of the dielectric layer have a <111> orientation.

10. A ferroelectric thin film structure of claim 1, further comprising:
    an amorphous dielectric layer on the seed layer.

11. An electronic device comprising the ferroelectric thin film structure of claim 1.

12. The electronic device of claim 11, wherein the electronic device is a transistor or a capacitor.

13. An electronic device comprising:
    a substrate;

a first dielectric layer over the substrate, the first dielectric layer including crystal grains having aligned crystal orientations;

a second dielectric layer over the substrate, the second dielectric layer including crystal grains having crystal orientations aligned in the substantially same direction as the crystal orientations of the first dielectric layer; and an electrode over the second dielectric layer;

wherein the first dielectric layer has a lattice parameter different from a lattice parameter of the second dielectric layer, and the first dielectric layer has a thickness of about 0.5 nm to about 3 nm and the second dielectric layer has a thickness of about 0.5 nm to about 20 nm, and wherein a material of the first dielectric layer is selected such that the aligned crystal orientations of the first dielectric layer are stable at an annealing temperature of the second dielectric layer.

14. The electronic device of claim 13, wherein the first dielectric layer comprises at least one of an oxide, a nitride, a chalcogenide, or a two-dimensional insulator material.

15. The electronic device of claim 13, wherein the second dielectric layer comprises a ferroelectric.

16. The electronic device of claim 15, wherein the second dielectric layer comprises at least one oxide of Hf, Si, Al, Zr, Y, La, Gd, or Sr.

17. The electronic device of claim 16, wherein the second dielectric layer further comprises a dopant.

18. The electronic device of claim 13, wherein the crystal orientations of the crystal grains of the first dielectric layer and of the second dielectric layer have a <111> orientation.

19. The electronic device of claim 13, further comprising: an amorphous dielectric layer on the first dielectric layer.

20. A ferroelectric thin film structure comprising:

a seed layer on a substrate, the seed layer including crystal grains having aligned crystal orientations;

an electrode; and a dielectric layer between the seed layer and the electrode, the dielectric layer comprising a ferroelectric and including crystal grains having crystal orientations aligned in the same direction as the crystal orientations of the seed layer, wherein the seed layer comprises at least one of a nitride, a chalcogenide, and a two-dimensional insulator material.

* * * * *